United States Patent
Lew et al.

(10) Patent No.: US 8,101,022 B2
(45) Date of Patent: Jan. 24, 2012

(54) CRYSTAL-GROWING FURNACE SYSTEM WITH EMERGENT PRESSURE-RELEASE ARRANGEMENT

(75) Inventors: Shiow-Jeng Lew, Taipei (TW); Hur-Lon Lin, Taipei (TW)

(73) Assignee: Green Energy Technology, Inc., Taipei (TW)

( * ) Notice: Subject to any disclaimer, the term of this patent is extended or adjusted under 35 U.S.C. 154(b) by 811 days.

(21) Appl. No.: 12/219,711

(22) Filed: Jul. 28, 2008

(65) Prior Publication Data
US 2009/0211520 A1    Aug. 27, 2009

(30) Foreign Application Priority Data
Feb. 27, 2008    (TW) ................................ 97106800 A

(51) Int. Cl.
C30B 15/00    (2006.01)
C30B 21/06    (2006.01)
C30B 27/02    (2006.01)
C30B 28/10    (2006.01)
C30B 30/04    (2006.01)

(52) U.S. Cl. ......... 117/217; 117/204; 117/206; 117/218
(58) Field of Classification Search .................. 117/217, 117/218
See application file for complete search history.

(56) References Cited

U.S. PATENT DOCUMENTS
| | | | | |
|---|---|---|---|---|
| 2,975,036 A | * | 3/1961 | Taylor et al. | 117/218 |
| 5,863,326 A | * | 1/1999 | Nause et al. | 117/217 |
| 2009/0205564 A1 | * | 8/2009 | Lew et al. | 117/206 |

FOREIGN PATENT DOCUMENTS
JP    63285191 A    * 11/1988

* cited by examiner

*Primary Examiner* — Jerry Lorengo
*Assistant Examiner* — Ross J Christie
(74) *Attorney, Agent, or Firm* — Bacon & Thomas, PLLC

(57) ABSTRACT

A crystal-growing furnace system with an emergent pressure-release arrangement includes an isolated chamber and a furnace upper body. The top board is provided with an opening and three first guides, and the furnace upper body with a lower opening and three second guides, wherein the lower opening of the furnace upper body covers, correspondingly, on the opening of the top board. In case a crystal-growing furnace, combined oppositely by the furnace upper body and the furnace lower body, has an over-high internal pressure, the pressure will overcome the weight of, and lift up the furnace upper body. At this moment, the furnace upper body will slightly move upward and away from enclosing the furnace lower body, so that the over-high internal pressure in the furnace will be released immediately to prevent the furnace from being exploded and from resulting in public accidents.

12 Claims, 4 Drawing Sheets

CRYSTAL-GROWING FURNACE SYSTEM WITH EMERGENT PRESSURE-RELEASE ARRANGEMENT

BACKGROUND OF THE INVENTION

1. Field of the Invention

The present invention relates to a crystal-growing furnace system, and more particularly, to a crystal-growing furnace system with an emergent pressure-release arrangement.

2. Description of Related Art

Referring to FIG. 1, a schematic view illustrating a conventional crystal-growing furnace system, a plurality of crystal-growing furnaces 91 and a controller room 92 are located together in a sealed factory 9. Because the crystal-growing furnaces 91 are all disposed in the factory 9, operators will suffer from noise and dust pollution during operation, and this will adversely affect health of the operators.

Moreover, the conventional furnace 91 may either lack a pressure-release arrangement or be provided with an undesirable pressure-release arrangement. Therefore, in case an abnormal pressure occurs in the furnace 91, for example, a crucible in the furnace containing molten silicon slurry fractures and that the silicon slurry leaks away such that the leaking silicon slurry melts and penetrates furnace wall and reacts with cooling pure water so as to produce a great amount of gas, resulting abruptly in the furnace 91 an over-high pressure. As shown in FIG. 1, pressure-release pipes 911 are connected with a common pressure-release pipe 98, respectively. However, due to a great damping occurred in the lengthy pipes, pressure cannot be easily released, or cannot be released transiently, the furnace may possibly explode. This will endanger the operators, because the crystal-growing furnaces 91 and the controller room 92 are located together in the sealed factory 9. As a result, public accidents become inevitable.

SUMMARY OF THE INVENTION

The present invention is to provide a crystal-growing furnace system with an emergent pressure-release arrangement, comprising an isolated chamber and a furnace upper body.

According to the present invention, the isolated chamber includes a top board, wherein the top board is provided with an opening and at least one first guide. The at least one first guide extends upward over the top board and is adjacent to the opening. A furnace lower body is arranged inside the isolated chamber, and is provided with an upper opening which corresponds, upward, to the opening of the top board.

The furnace upper body includes a lower opening and at least one second guide. The lower opening is located above and correspondingly to the opening of the top board, and that the upper opening of the furnace lower body and the lower opening of the furnace upper body are enclosed with each other so as to form a furnace inner space. The at least one second guide is secured to, and extends outward of, the furnace upper body, and is adjacent to the lower opening. The at least one second guide is coupled, correspondingly, to the at least one first guide, such that the first guide is guided by the at least one second guide for an upward or downward movement, relatively.

Therefore, in case a crystal-growing furnace, combined oppositely by the furnace upper body and the furnace lower body, has an over-high internal pressure, the pressure will overcome the weight of, and lift up the furnace upper body. At this moment, the furnace upper body will slightly move upward and away from enclosing the furnace lower body, as following the first guide guided vertically by the second guide, so that the over-high internal pressure in the furnace will be released immediately. Thereafter, the furnace upper body will soon return to the opening of the top board due to its own weight. Under such circumstances, the furnace upper body will not fall down or fly away, and more significantly, the furnace will not explode and result in public accidents due to accumulation of high pressure.

The at least one first guide of the top board includes an upward rod, while the at least one second guide of the furnace upper body includes a positioning ring, where plural positioning rings are spaced apart equidistantly, and operatively receive plural upward rods.

Further, according to the present invention, the top board is, circumferentially at the opening, provided with a reinforced ring including an upward ring. The furnace upper body is provided, circumferentially at the lower opening, with a downward flange. The furnace upper body covers, correspondingly, on the upward ring of the top board through the downward flange; or the upward ring of the top board may surround the downward flange. Of course, the downward flange of the furnace upper body may be of various shapes, such as an oblique downward flange declining outward and downward from the furnace upper body. In contrast, the upward ring of the top board may be of oblique annular flange declining upward and inward, such that the oblique downward flange covers on periphery of the oblique upward annular flange so as to achieve the purpose of covering and positioning.

The abnormal high pressure occurred within the furnace can be appropriately released to outside ambiance via gaps formed between the lower opening of the furnace upper body and the reinforced ring, so that explosions and public accidents, due to over-high pressure in the furnace, can be avoided.

The top board includes a reinforced concrete frame, cured after grouting of concrete slurry, so as to reinforce the structure of the whole top board. Alternatively, the top board may be made of steel plate. The furnace upper body is further fixed, penetratingly, with a pressure-release tube set at a predetermined pressure. When the pressure-release tube has sensed a pressure inside the furnace upper body higher than that of the predetermined pressure, the pressure-release tube will be opened for pressure release. The pressure-release tube may be a cross decompression tube. Normally, the pressure-release tube will be set at a lower determined pressure so as to protect the furnace body, such that the pressure-release tube can be used together with the emergent pressure-release arrangement, and that a double pressure-release protection can be obtained.

According to the present invention, a lifting device is disposed in the isolated chamber, such that the lifting device is provided for selectively moving the furnace lower body upward so that the upper opening gets close to the opening of the top board, or downward and departs from the opening of the top board. The lifting device includes at least one vertical screw, at least one nut, at least one universal link, and a driving source. The at least one nut is engaged with the at least one vertical screw, correspondingly. The driving source rotates the at least one universal link so as to rotate the at least one vertical screw.

The furnace upper body includes an upper furnace wall cooling assembly, which, preferably, refers to a spray cooling assembly, for dispersing heat directly to atmosphere. Or alternatively, a conventional water-jacket cooling system can still be used for this purpose. The furnace lower body includes a lower furnace wall cooling assembly, which, preferably, refers to a spray cooling assembly. Likewise, a conventional water-jacket cooling system will do.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
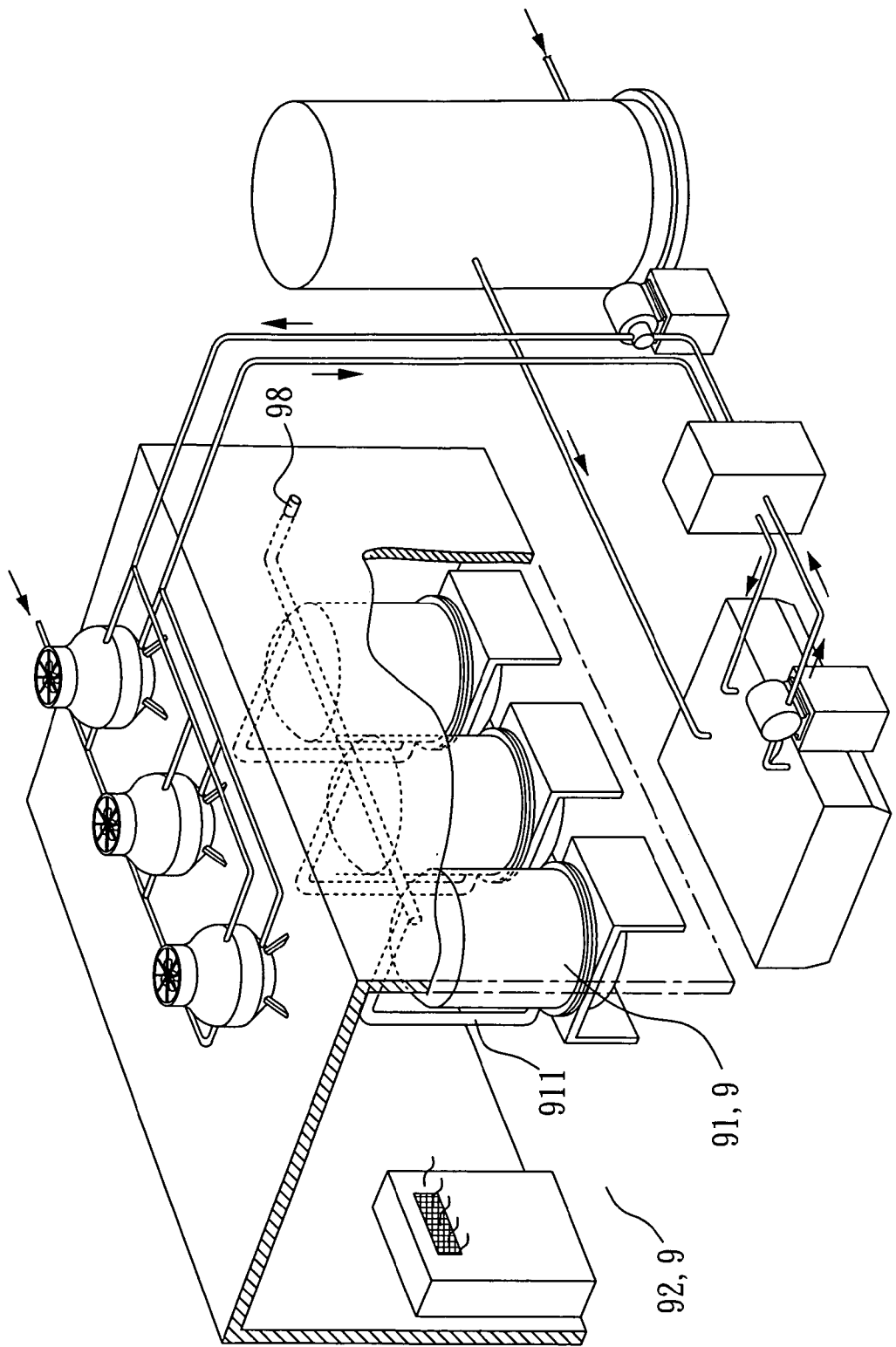
FIG. 1 is a schematic view illustrating a conventional crystal-growing furnace system.
Figure 2:
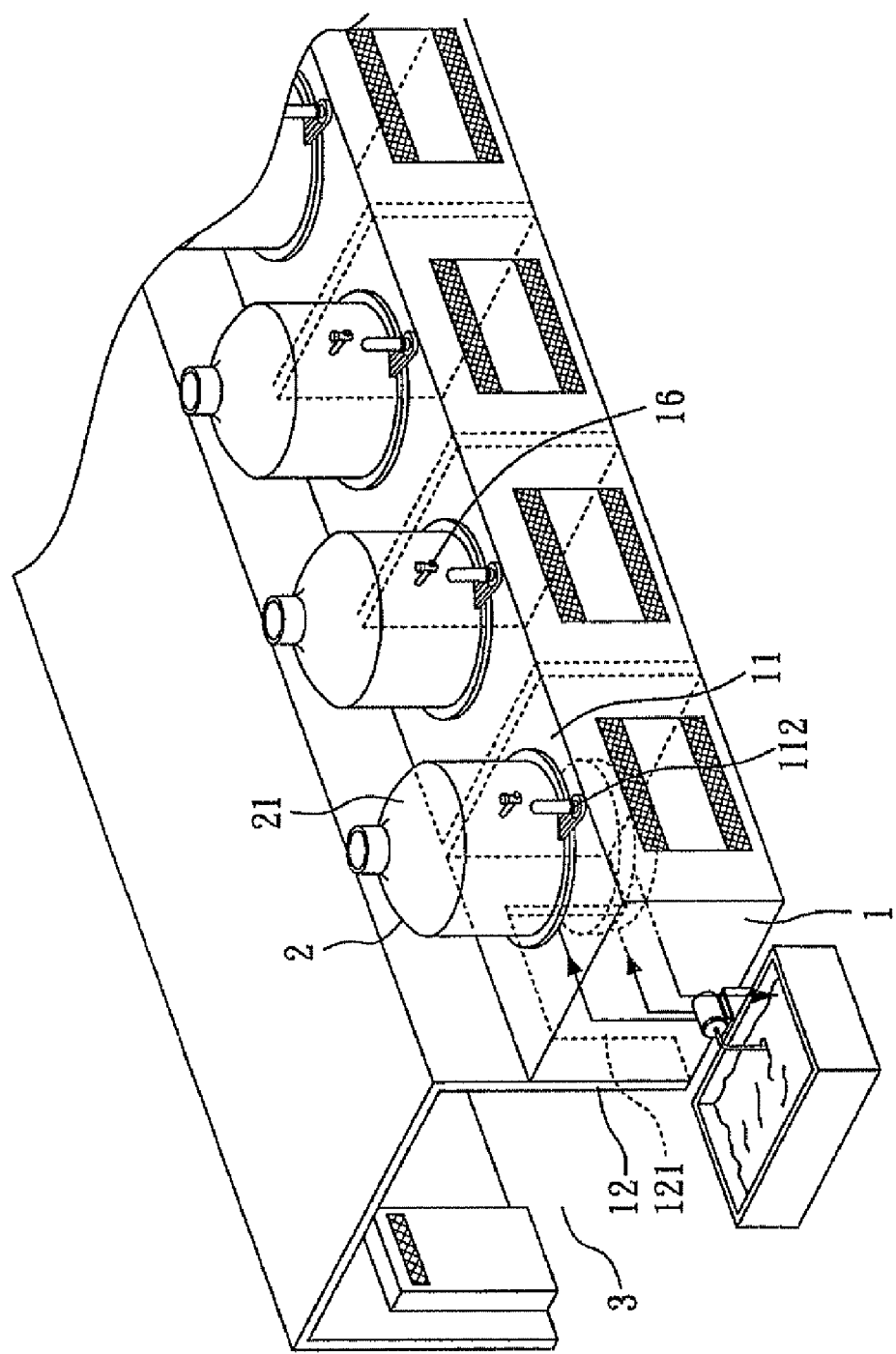
FIG. 2 is a schematic view illustrating a crystal-growing furnace system according to the present invention.
Figure 3:
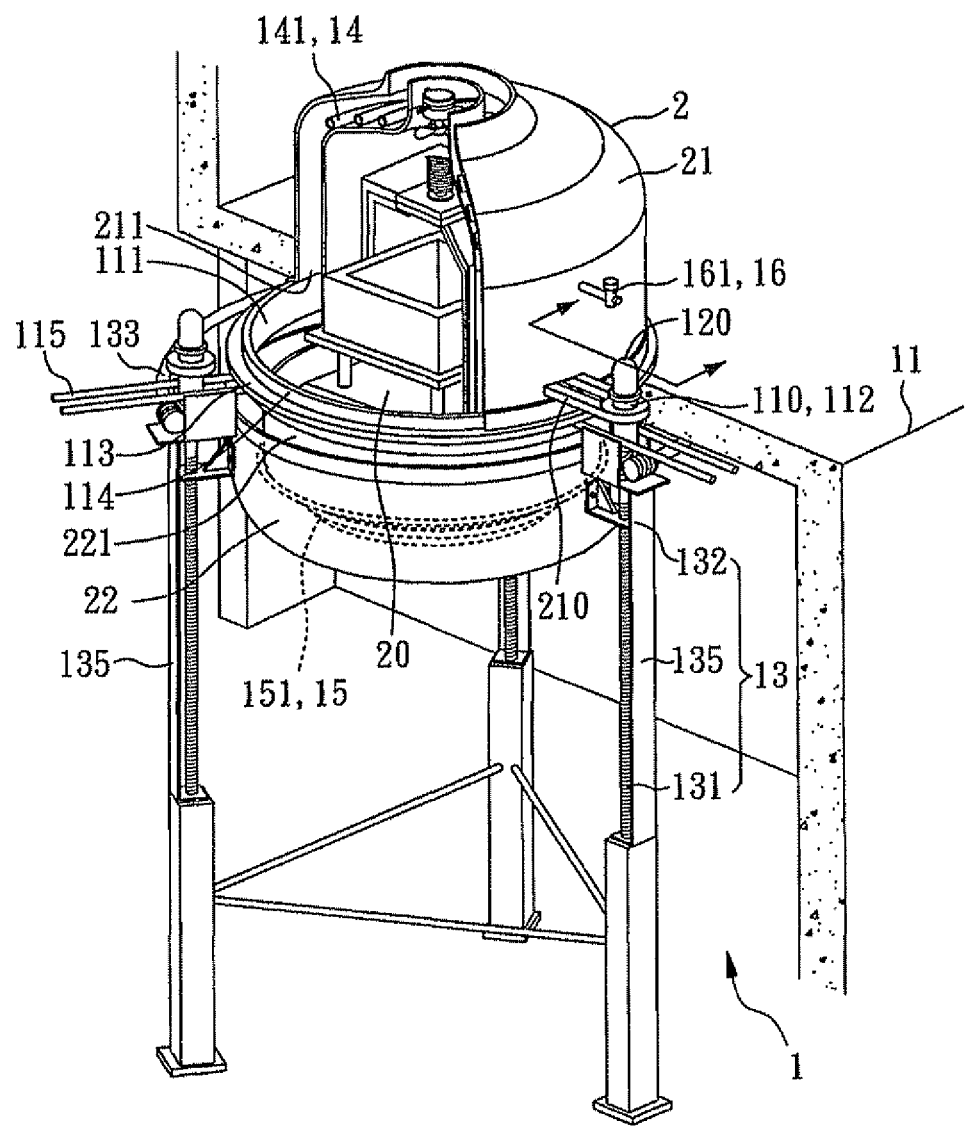
FIG. 3 is a perspective view illustrating part of the crystal-growing furnace system according to the present invention.

Referring to FIGS. 2 and 3, a schematic view illustrating a crystal-growing furnace system according to the present invention and a perspective view illustrating part of the crystal-growing furnace system, a crystal-growing furnace system with an emergent pressure-release arrangement comprises an isolated chamber 1 and a furnace upper body 21.

The isolated chamber 1 includes a top board 11, wherein the top board 11 is provided with an opening 111 and at least one first guide 112. The at least one first guide 112 extends upward over the top board 11 and is adjacent to the opening 111. A furnace lower body 22 is arranged inside the isolated chamber 1, and is provided with an upper opening 221 which corresponds, upward, to the opening 111 of the top board 11.

Figure 4:
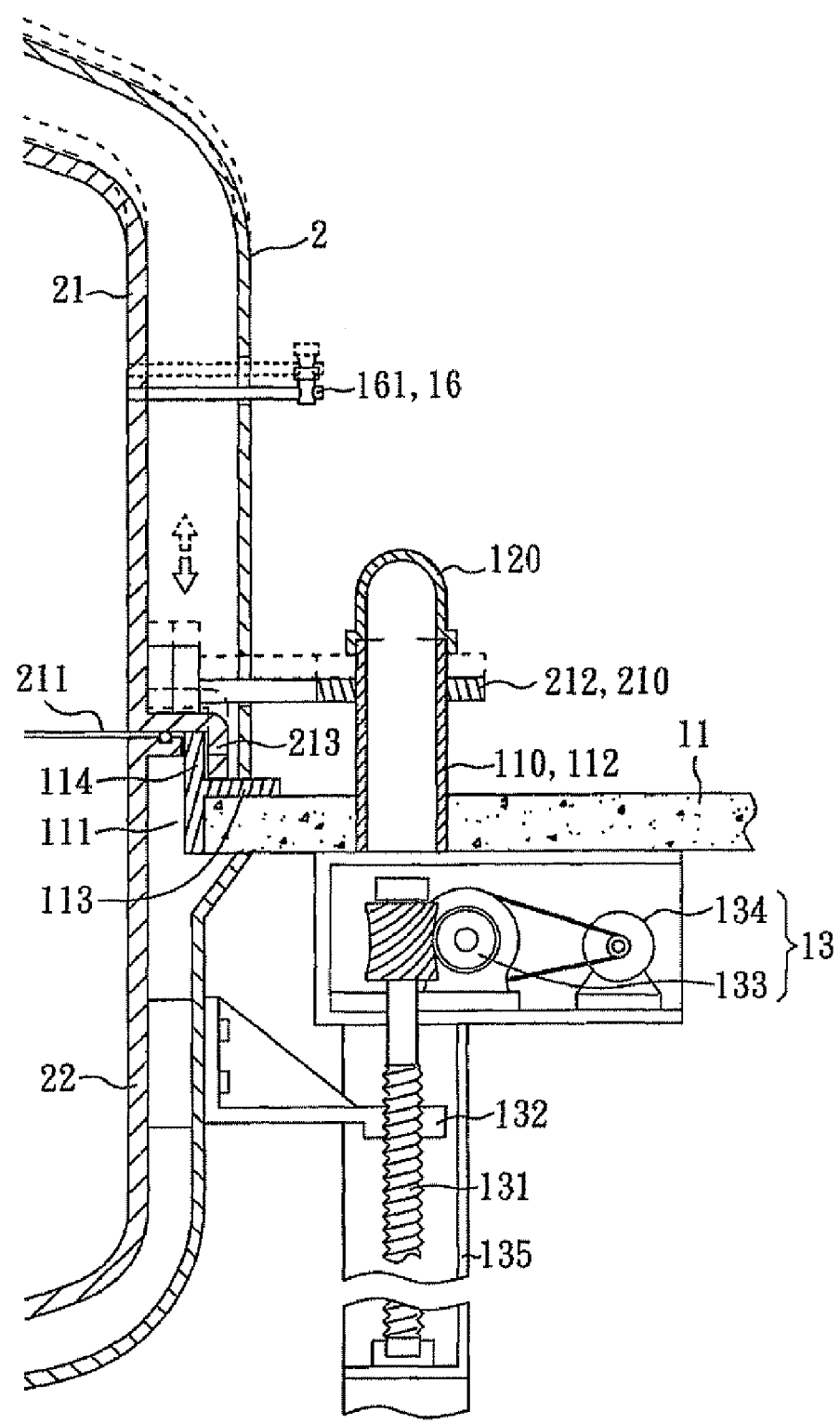
FIG. 4 is a cross-sectional view illustrating part of the crystal-growing furnace system according to the present invention.

Now referring to FIG. 4, a cross-sectional view illustrating part of the crystal-growing furnace system according to the present invention, the furnace upper body 21 includes a lower opening 211 and three second guides 210. The lower opening 211 is located above and correspondingly to the opening 111 of the top board 11, and is able to sealingly receive the upper opening 221 of the furnace lower body 22. The three second guides 210 are secured to, and extend outward of, the furnace upper body 21, and adjacent to the lower opening 211. The three second guides 210 are coupled, correspondingly, to three first guides 112, such that the first guides 112 are guided by the second guides 210 for an upward or downward movement, relatively.

As shown in FIG. 4, the three first guides 112 each includes an upward rod 110, while the three second guides 210 each includes a positioning ring 212, where the three positioning rings 212 are spaced apart equidistantly, and operatively receive the three upward rods 110.

According to the present invention, the upward rod 110 is cylindrical, and is covered with a round cap 120 so as to prevent water or dust from invading therein. Therefore, in case a crystal-growing furnace 2, combined oppositely by the furnace upper body 21 and the furnace lower body 22, has an over-high internal pressure, the pressure will overcome the weight of, and lift up the furnace upper body 21. At this moment, the furnace upper body 21 will slightly move upward and away from enclosing the furnace lower body 22, following the upward rods 110 guided by the positioning rings 212, so that the over-high internal pressure in the furnace 2 will be released immediately. Thereafter, the furnace upper body 21 will soon return to the opening 111 of the top board 11 due to its own weight. Under such circumstances, the furnace upper body 21 will not fall down or fly away, and more significantly, the furnace 2 will not explode and result in public accidents due to accumulation of high pressure.

Further, referring to FIG. 4, the top board 11 is, circumferentially, at the opening 111, provided with a reinforced ring 113 including an upward ring 114. The furnace upper body 21 is provided, circumferentially, at the lower opening 211, with a downward flange 213. The furnace upper body 21 achieves the purpose of covering on the lower furnace body 22 through the downward flange 213 which covers, correspondingly, on the upward ring 114 of the top board 11.

As shown in FIG. 3, the top board 11 includes a reinforced concrete frame 115, cured after grouting of concrete slurry, so as to reinforce the structure of the whole top board 11. The reinforced ring 113 is welded to the reinforced concrete frame 115 so as to reinforce the strength thereof and to support the weight of the furnace upper body 21. Alternatively, the top board 11 may be made of steel plate. In the present invention, a lifting device 13, consisting of three supporting tubes 135, is provided for supporting, underneath, the top board 11 firmly.

Referring to FIGS. 3 and 4, the furnace upper body 21 is further fixed, penetratingly, with a pressure-release tube 16, which may be a cross decompression tube 161, set with a predetermined pressure. When the pressure-release tube 16 has sensed a pressure inside the furnace upper body 21 higher than that of the predetermined pressure, the pressure-release tube 16 will be opened and that the higher pressure will be released. Normally, the pressure-release tube 16 will be set at a lower determined pressure for pressure release so as to protect the furnace body, such that the pressure-release tube can be used together with the emergent pressure-release arrangement, according to the present invention, so as to obtain a double pressure-release protection.

As shown in FIG. 3 and FIG. 4, the lifting device 13 is disposed in the isolated chamber 1, such that the lifting device 13 is provided for selectively moving the furnace lower body 22 upward so that the upper opening 221 gets close to the opening 111 of the top board 11, or downward and departs from the opening 111. When the furnace lower body 22 is moved upward by the lifting device 13, the upper opening 221 can get closer to and beneath the opening 111, and being sealingly engaged with the lower opening 211 of the furnace upper body 21, so as to be assembled with the furnace upper body 21 into the crystal-growing furnace 2 in which a furnace inner space 20 is formed.

The lifting device 13 includes three vertical screws 131, three nuts 132, a universal link 133, and a driving source 134. The three nuts 132 are engaged with the three vertical screws 131, correspondingly. The driving source 134 rotates the universal link 133 so as to rotate the vertical screws 131, such that the nuts 132 can be moved upward or downward relative to the rotation of the vertical screws 131. The vertical screws 131 are disposed inside the supporting tubes 135 so as to save space.

Still further, referring to FIG. 3, the furnace upper body 21 includes an upper furnace wall cooling assembly 14, which, preferably, refers to a spray cooling assembly 141, for dispersing heat directly to atmosphere. Or alternatively, a conventional water-jacket cooling system can still be used for this purpose. The furnace lower body 22 includes a lower furnace wall cooling assembly 15, which, preferably, refers to a spray cooling assembly 151. Likewise, a conventional water-jacket cooling system will do.

According to the present invention, as shown in FIG. 2, a controller room 3 is located neighboring to the isolated chamber 1, where the controller room 3 and the isolated chamber 1 are separated from each other by a side wall 12, and a door 121 is provided on the sidewall 12. The door 121 is selectively closed or opened so as to isolate the controller room 3 from the isolated chamber 1 when closed, or to communicate the controller room 3 with the isolated chamber 1 when opened.

Therefore, the high-temperature and dusty working condition is confined in the isolated chamber 1, without affecting operators in the controller room 3 for operation of control panel facilities so as to ensure safety of personnel. Further, in case the furnace upper body 21, which is located above the isolated chamber 1, is raised and opened for pressure release, high temperature and high pressure will be dispersed to the atmosphere outside of the isolated chamber 1, as such, personnel in the controller room 3 will not be jeopardized.

Although the present invention has been explained in relation to its preferred embodiments, it is to be understood that many other possible modifications and variations can be made without departing from the scope of the invention as hereinafter claimed.

What is claimed is:

1. A crystal-growing furnace system with an emergent pressure-release arrangement, comprising:
   an isolated chamber, including a top board provided with an opening and at least one first guide, wherein the at least one first guide extends upward over the top board and is adjacent to the opening, and wherein a furnace lower body is arranged inside the isolated chamber and is provided with an upper opening which corresponds, upward, to the opening of the top board; and
   a furnace upper body, including a lower opening and at least one second guide, wherein the lower opening is located above and correspondingly to the opening of the top board, and the at least one second guide is secured to, and extend outward of, the furnace upper body, and adjacent to the lower opening, and the at least one second guide is coupled, correspondingly, to the at least one first guide, such that the first guide is guided by the at least one second guide for an upward or downward movement, relatively, so as to release pressure outward of the furnace.

2. The crystal-growing furnace system with an emergent pressure-release arrangement as claimed in claim 1, wherein the at least one first guide of the top board includes an upward rod, while the at least one second guide of the furnace upper body includes a positioning ring, and wherein plural positioning rings are spaced apart equidistantly, and operatively receive plural upward rods.

3. The crystal-growing furnace system with an emergent pressure-release arrangement as claimed in claim 1, wherein the top board is, circumferentially, at the opening, provided with a reinforced ring including an upward ring; and wherein the furnace upper body is provided, circumferentially, at the lower opening, with a downward flange, and the furnace upper body covers, correspondingly, on the upward ring of the top board through the downward flange.

4. The crystal-growing furnace system with an emergent pressure-release arrangement as claimed in claim 1, wherein the top board includes a reinforced concrete frame.

5. The crystal-growing furnace system with an emergent pressure-release arrangement as claimed in claim 1, wherein the furnace upper body is further fixed, penetratingly, with a pressure-release tube set at a predetermined pressure, and when the pressure-release tube has sensed a pressure inside the furnace upper body higher than that of the predetermined pressure, the pressure-release tube will be opened for pressure release.

6. The crystal-growing furnace system with an emergent pressure-release arrangement as claimed in claim 5, wherein the pressure-release tube is a cross decompression tube.

7. The crystal-growing furnace system with an emergent pressure-release arrangement as claimed in claim 1, wherein a lifting device is disposed in the isolated chamber, such that the lifting device is provided for selectively moving the furnace lower body upward so that the upper opening gets close to the opening of the top board, or downward and departs from the opening of the top board.

8. The crystal-growing furnace system with an emergent pressure-release arrangement as claimed in claim 7, wherein the lifting device includes at least one vertical screw, at least one nut, at least one universal link, and a driving source; and wherein the at least one nut is engaged with the at least one vertical screw, correspondingly, and the driving source rotates the at least one universal link so as to rotate the at least one vertical screw.

9. The crystal-growing furnace system with an emergent pressure-release arrangement as claimed in claim 1, wherein the furnace upper body includes an upper furnace wall cooling assembly.

10. The crystal-growing furnace system with an emergent pressure-release arrangement as claimed in claim 9, wherein the upper furnace wall cooling assembly is a spray cooling assembly.

11. The crystal-growing furnace system with an emergent pressure-release arrangement as claimed in claim 1, wherein the furnace lower body includes a lower furnace wall cooling assembly.

12. The crystal-growing furnace system with an emergent pressure-release arrangement as claimed in claim 11, wherein the lower furnace wall cooling assembly is a spray cooling assembly.

* * * * *